United States Patent
Poskatcheev et al.

(10) Patent No.: US 7,477,078 B2
(45) Date of Patent: Jan. 13, 2009

(54) VARIABLE PHASE BIT SAMPLING WITH MINIMIZED SYNCHRONIZATION LOSS

(75) Inventors: Andrei Poskatcheev, Menlo Park, CA (US); Senthil Thandapani, Menlo Park, CA (US); Clint Fincher, Menlo Park, CA (US)

(73) Assignee: Synthesys Research, Inc, Menlo Park, CA (US)

( * ) Notice: Subject to any disclaimer, the term of this patent is extended or adjusted under 35 U.S.C. 154(b) by 0 days.

(21) Appl. No.: 11/089,557

(22) Filed: Jan. 19, 2005

(65) Prior Publication Data

US 2005/0190874 A1 Sep. 1, 2005

(51) Int. Cl.
*G11C 27/02* (2006.01)
(52) U.S. Cl. .................... 327/91; 327/94; 327/95; 327/96
(58) Field of Classification Search .................. 327/91, 327/94–96, 154, 161
See application file for complete search history.

(56) References Cited

U.S. PATENT DOCUMENTS 4,132,095 A * 1/1979 Bowman .................. 72/10.4
6,567,490 B1 * 5/2003 Hayashi et al. ............ 375/376

* cited by examiner

*Primary Examiner*—Kenneth B. Wells
(74) *Attorney, Agent, or Firm*—Peninsula IP Group; Douglas A. Chaikin

(57) ABSTRACT

Variable phase bit sampling implementations are disclosed which minimize requirements for downstream digital processing resynchronization in systems that incorporate adjustable bit phase sampling that utilize variable delay elements which can interrupt the clocking stream signal. A sampling device includes a sampling circuit operative to provide an output signal in response to a data signal, where the sampling circuit includes a data input and a clock input. A variable delay circuit provides an adjustable trigger signal to the clock input in response to a first delay control signal. A fixed delay circuit delays the output signal by a predetermined amount of time in response to at least one delay control signal. By implementing the sampling device, a system clock signal may be connected directly to a downstream digital processing circuit, thereby allowing any potentially corrupted clock stream from the variable delay element to be connected only to the data sampling device and to utilize a fixed delay section that can be programmatically inserted between the output of the sampling device and the input to the downstream digital processing device.

8 Claims, 4 Drawing Sheets

VARIABLE PHASE BIT SAMPLING WITH MINIMIZED SYNCHRONIZATION LOSS

BACKGROUND OF THE INVENTION

1. Field of the Invention

The present invention generally relates to systems that require variable phase bit sampling of data streams and, more particularly, to performance measuring of data bit streams where multiple variable phase sampling devices are required to simultaneously sample the same bit cell at possibly different phases and where synchronization successfully at one phase offset within the bit cell is used at other phase offsets within the bit cell.

2. Description of the Related Art

In recent years, data rates in communications systems have continued to grow at a fast pace and continues to push the physical limits of communications components. Such advances push the need for new performance measuring equipment that can quickly and effectively grade the capabilities of communications systems. Many of these large advances have made older methods obsolete in favor of newer, faster approaches; however, these new approaches require optimized solutions for older, less-considered problems in order to achieve required larger-system performance. Being able to make sampling phase changes without glitching downstream processing is one such problem.

Devices and technologies from SyntheSys Research, Inc. and others require many fast, short measurements of sampled bit data at various phase offsets within a data bit period window. Changing phase offset of bit sampling within a bit period is typically done by using a variable delay mechanism. This element of variable delay for very high performance measuring devices is configured in the clocking path to the sampling device. Variable delays are often placed in the clocking path rather than the data path because of data dependency found in variable delay technology that would distort the data waveform under test. By placing a single-frequency clock signal through the variable delay component, precise and clean delay is achieved. Variable delay technologies that interrupt the clocking signal passing through the variable delay element when delay setting changes are made, will output incomplete or partial clock signals which cause receiving devices that depend on defined bit clock windows or exactly the correct number of clock edges to errantly go into bad states.

Conventional devices that measure performance of data streams utilizing variable delay technology that disrupt the clocking stream are not impacted by the overhead added by the need to resynchronize when delay settings were changed because these devices were limited to making longer-term average bit error rate measurements. Measurements that took many seconds to perform could easily hide resynchronization processes that took a second. However, new measurement methods require that individual measurement periods last many times less than one second, which means that overhead for resynchronization could dominate the time of the measurement if resynchronization was always necessary after each sampling phase change.

There are several commercially available testing systems that characterize and validate the performance of a data signal from a device or communications subsystems using bit error rate measurement methods. These include bit error rate measuring instruments from Agilent Technologies, Anritsu, Advantest and SHF. In each of these systems, non-overlapping techniques are used to create various methods for changing the phase at which bit cells are sampled and performing bit error rate and other measurement techniques. However, these methods require either variable phase setting mechanisms that do not interrupt clocking signals or processing resynchronization at a penalizing rate. It is key to be able to create short and fast measurement intervals utilizing variable phase setting mechanisms that do disrupt clocks as they are cost effective, they implement large delay ranges at very high frequencies and support superior delay resolutions.

Furthermore, no known art exists for mechanisms that allow independently adjusting different phase offsets for two or more tightly synchronized sampling devices such that downstream digital processing elements could simultaneously use the sampling device results while being assured that synchronization had been maintained between the multiple channels during any sampling phase change.

Additionally, no known art exists for mechanisms that allow synchronization taken at one phase offset within the bit cell to be maintained and used after the sampling phase was changed to another phase offset within the bit cell by a variable delay mechanism that would interrupt the clocking signal.

What is needed is a device and method that allows for clocking interruptions that typically occur when making flexible setting of sampling clock phase in high-performance systems to not cause clocking interruptions in downstream processing of post bit-sampled data. Such an invention will enable that synchronization of this post bit-sampled data is not lost from one setting to the next or from one sampling device to the next as in parallel sampling architectures.

SUMMARY OF THE INVENTION

Generically, sampling devices such D-type flip-flops are devices that copy the logic level of the input signal onto the output signal after a suitable strobe (clock) signal's edge. This edge is typically the rising edge, but could just as well be a falling edge. For a sampling device to be assured to sample the correct value, the applied data signal to be sampled must have been present at the input to the sampling device with sufficient setup and hold time. The result of not sampling the correct level when a clocking edge is presented to the sampling device is that the output of the sampling device will be inaccurate for the period of that sample. In either event, each sample only lasts for one period of the sampling clock and is replaced with the next sample after the next clock sampling edge.

Digital processing elements or state machine devices such as counters or state control processors depend on clocking signals in a similar way to flip flops in that the next state (or counter value) is computed based on the previous state (or counter value) and is sampled into the state-holding sampling device (such as a D-flip flop) when the next sampling edge occurs. The maximum rate of the sampling clock in these processing elements depends on the amount of computation necessary from the time a sampling edge occurs to output a new state and the processing it takes to compute the new next state based on this newly output old state. The result of having a sampling period that is too small is that the computed next state would not be ready when the shorted-clock sampling edge arrived allowing an errant state (or count) to be latched. This is not a self-healing process as, from this point on, all future states (or counts) would be wrong. A flip-flop in error when sampling an input data stream due to a glitched clock would produce a single bit decision error that would heal after the next bit is sampled. A state machine in error because a shorted, glitched clock caused it to sample the next state prematurely would be permanently in error from then on.

It is an object of the present invention to allow phase sampling adjustments at input data bit sampling circuits using variable delay devices that can glitch clocking signals and to not allow the glitched clock to be used by downstream digital processing elements.

It is an object of the present invention to accomplish the aforementioned goal by utilizing a lower-quality fixed delay element that can be switched into the path of the sampling device output to advance/retard the timing of the sampling device output independent of the variable phase sampling adjustment applied to the sampling device in order to meet the setup and hold timing requirements for down-stream digital processing.

It is an object of the present invention to sample the input data bit with the sampling device without perturbing the quality of the input signal as it is sampled and to pass the result of this sampling to downstream processing elements without error for a large range of operating frequencies which can cover many octaves of frequency.

It is an object of the present invention to enable maintaining synchronization of downstream digital processing elements taken at one phase offset within the bit period such that the synchronization remains valid and can be used for other digital processing required at another phase offset within the bit period which results from a sampling phase change that may glitch the clock stream.

It is a further object of the present invention to support multiple sampling devices each with their own phase offset adjustments in a fashion such that coordinated synchronization of the digital processing elements for each of the multiple sampling device channels can be assured and maintained even while phase offset adjustments, which may cause glitches in the clock stream are performed.

Finally, it is an object of the present invention to use the knowledge of the measured frequency and information taken to properly engage or not engage the added fixed delay element into the path between the sampling device and any downstream digital processing element to enable meeting the setup and hold time requirements at all frequencies of interest.

The aforementioned objects and associated advantages resulting therefrom are provided by a sampling device including a sampling circuit operative to provide an output signal in response to a data signal, where the sampling circuit includes a data input and a clock input. A variable delay circuit provides an adjustable trigger signal to the clock input in response to a first delay control signal. A fixed delay circuit delays the output signal by a predetermined amount of time in response to at least one delay control signal. In this manner, a system clock signal may be connected directly to a downstream digital processing circuit, thereby allowing any potentially corrupted clock stream from the variable delay element to be connected only to the data sampling device and to utilize a fixed delay section that can be programmatically inserted between the output of the sampling device and the input to the downstream digital processing device.

BRIEF DESCRIPTION OF THE DRAWINGS

For a further understanding of the objects and advantages provided by the present invention, reference should be had to the following detailed description, taken in conjunction with the accompanying drawing, in which like parts are given like reference numerals and wherein.

DETAILED DESCRIPTION OF THE INVENTION

Figure 1:
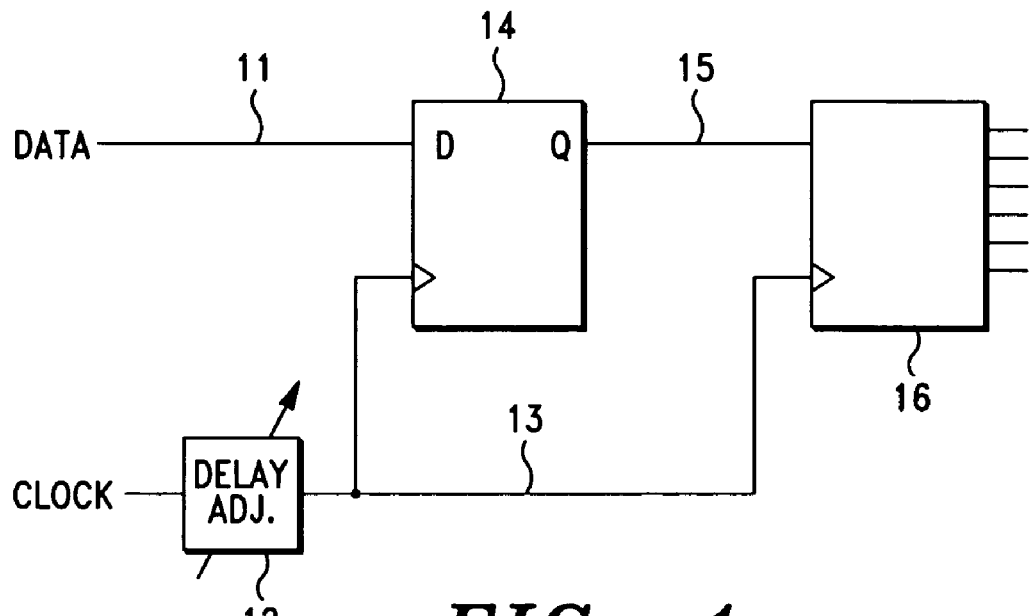
FIGS. 1-2 are schematic block diagrams of conventional adjustable phase bit sampling devices.

The present invention will now be described in greater detail with reference to the accompanying drawings, in which the preferred embodiments of the invention are shown. The present invention may, however, be embodied in many different forms and should not be construed as limited to the embodiment set forth herein; rather these embodiments are provided so that this disclosure will be thorough and complete and will fully convey the invention to those skilled in the art.

The present invention provides a method and apparatus which ensures that potentially synchronization-loosing clocking interruptions (glitches) caused by changing the sampling point within the bit period of one or more sampling devices will not cause the loss of synchronization of downstream digital processing elements. It is un-avoidable in high-frequency variable delay technologies with other attractive attributes to eliminate the possibility of clocking glitches when variable delay settings are changed. Because of this, it is important to provide a method and device that is not hurt by such a glitch. The present invention achieves this goal by allowing the potentially glitched clock to only go to devices that will recover from the momentary glitch without any long-term impact in later processing. Devices that are susceptible to glitches—for example, devices with state memory or counters—never receive clocking signals that have to go through the variable delay element.

To permit a larger system to properly work where the sampling device is clocked by a clock phase that is not aligned with the clock phase used by the downstream digital processing elements (in fact, can be at any programmable phase relationship), special consideration must be made to achieve proper setup and hold timing at the hand-off of sampled data from the sampling device to the digital processing device. In the present invention, a fixed delay element having a hold or delay period defined by the sum of the required setup and hold times of the downstream digital processing elements, is configured such that it can be added to the normal delay between the output of the sampling device and the input of the downstream digital processing elements. In this fashion, when an operating frequency is chosen and a sampling phase offset is chosen that would cause the output of the sampling device to violate the required sample and hold time of the downstream digital processing elements, it is guaranteed, then, that by adding this fixed delay element to the output of the sampling device path, that the setup and hold times of the downstream processing elements will be met.

Programmatically inserting a fixed delay element into an already-sampled digital bit stream is considerably easier than inserting delay into an analog stream because of the natural immunity to noise and variation provided by the digital logic abstraction. Minor variations in the signal amplitudes caused by the imperfections of adding switches and traces to implement a switchable fixed-delay function go completely unnoticed to a digital bit receiver in the input of the digital processing element.

Figure 2:
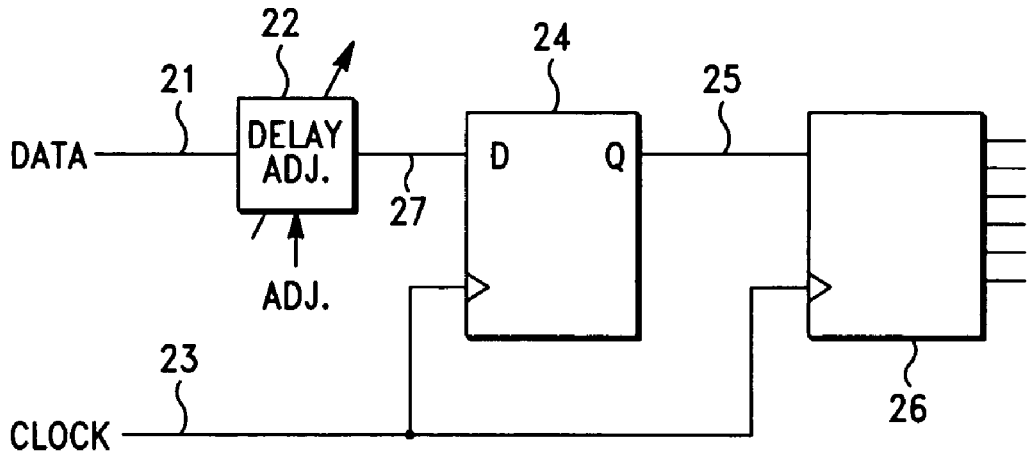

For a more complete understanding of the functions in accordance with this invention, the functionality will be explained with respect to the figures. FIGS. 1 and 2 are schematic block diagrams illustrating conventional devices and methods for configuring variable phase offset bit sampling with sampling devices and downstream digital processing elements. FIG. 1 illustrates a configuration 10 where the variable delay element 12 is inserted in the clocking path which sufficiently allows the sampling time of the data 11 presented to the sampling device 14 to be adjusted. However, the output 13 of the variable delay element 12 is also presented to a downstream digital processing element 16 exposing this downstream element 16 to possible glitches introduced in the variable delay element 12, for example, when the delay setting is changed. This configuration conveniently pipelines data 11 from the sampling device 14 to the downstream digital processing element 16 causing no need for control over maintaining the setup and hold time of the sampled results 15 as presented to the downstream digital processing element 16 as their relationship is fixed because they are both clocked from the same signal 13. This convenience does not overcome the problem that the downstream digital processing element 16 would be presented with glitches and therefore would require constant resynchronization after each delay setting change.

FIG. 2 illustrates the variable delay element being configured into the data path. in this device 20; the input clock signal 23 is presented to both the sampling device 24 and the downstream digital processing element 26 preserving two nice features—that the phase relationship between the output of the sampling device 24 is always constant with respect to the setup and hold time requirements of the downstream digital processing element 26 (as they are both clocked with the same signal 23), and that the digital processing element 26 does not use a clock that has been passed through a potentially glitch-causing variable delay element 22. However, this architecture 20 requires that the variable delay element 22 be placed in the data path 21 inflicting any and all types of disturbances caused by the variable delay element 22 onto the analog data signal 27 before it is sampled. Variable delay technology at the highest frequencies of today's communications systems are typically susceptible to data-dependent delay variations and pattern sensitivities that distort the quality of the signal 27, and this would mean that the sampling device 24 would mistakenly measure errant results due to the variable delay element 22 rather than the input data signal 21. This is particularly unacceptable at very high data rates.

Figure 3:
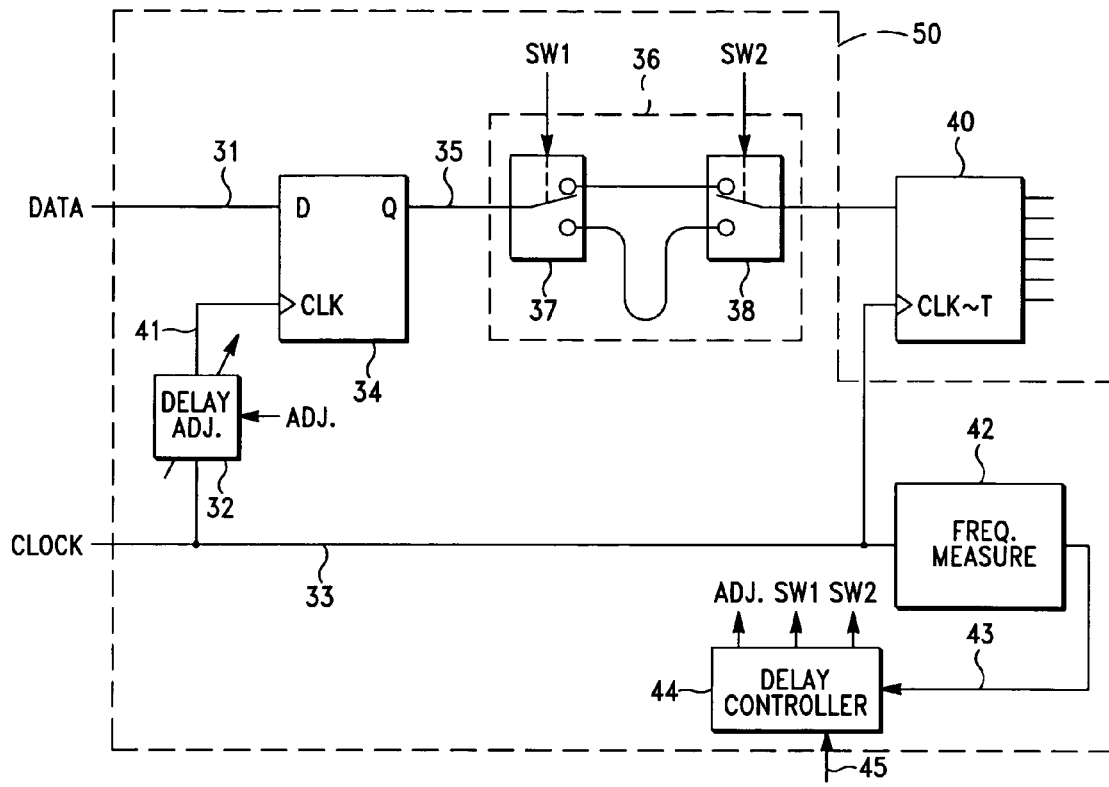
FIG. 3 is a schematic block diagram of a system incorporating an exemplary embodiment of a variable phase bit sampling device according to the present invention.

FIG. 3 is a schematic block diagram of a system 30 incorporating the variable phase bit sampling device 50 according to an exemplary embodiment of the present invention. As shown, a variable delay circuit 32, for example, an adjustable resistor, varactor, integrated circuit or other suitable device or combination thereof, is placed in the path of the system clock signal 33 and provides a trigger signal 41 to a clock or trigger input (CLK) of sampling circuit 34, for example, a D-type flip-flop, dedicated piece of hardware (e.g. ASIC), software executing on one or more processors (not shown) or other suitable sampling devices and combinations thereof and not in the path of the system clock signal 33 going to the trigger or clock input (CLK-T) of downstream digital processing circuit 40, for example, a digital signal processing (DSP) circuit, an application specific integrated circuit (ASIC), software executing on one or more processors, a state machine or other suitable device and combinations thereof. The output 41 of the variable delay circuit 32 is a delayed version of the system clock signal 33. The amount of the delay is controlled by an adjustable control signal (ADJ). To make up for the variable phase output 35 of the sampling circuit 34 so that It does not encroach on the required setup and hold time of the digital processing circuit 40, a programmable delay circuit 36, including a first switch 37 and a second switch 38 is used to switch-in or otherwise add an additional fixed delay into the output data 35 from the sampling device 34 to move or otherwise delay the output data 35 by an amount equal to at least the sum of the setup and hold times of the downstream digital processing circuit 40.

A frequency detection and measurement circuit 42, for example, a counter or other suitable hardware device or software program executing on one or more processing devices, adapted to measure the frequency of an input signal is coupled to and measures the frequency of the system clock signal 33 and provides a clock frequency signal 43 representing the frequency of the system clock signal 33. The amount of delay provided by the programmable delay circuit 36 is controlled by a delay controller 44. The delay controller 44 may beg for example, a discrete logic circuit, a DSP, an ASIC, state machine, software executing on one or more processing devices or any suitable device capable of processing data or combinations thereof.

In application, the delay controller 44 receives as inputs the clock frequency signal 43 and the desired clock frequency and phase settings (or suitable requirements) 45 for the downstream processing circuit 40. Based on the aforementioned inputs, through an appropriate algorithm, the delay controller 44 provides a first delay control signal (ADJ) that varies or otherwise adjusts the amount of delay provided to the system clock 33 by the variable delay circuit 32; a second delay control signal (SW1) that varies or otherwise adjusts the amount of delay provided by the first switch 37; and a third delay control signal (SW2) that varies or otherwise adjusts the amount of delay provided by the second switch SW2. By using the variable phase bit sampling device 50 of the present invention, if at any particular phase setting of the variable delay circuit 32, the sampled data 35 from the sampling circuit 34 would violate the setup and hold time requirements of the downstream digital processing circuit 40, the added delay provided by the programmable delay circuit 36 will guarantee that the setup and hold times will be met.

The delay controller 44 does not receive a potentially glitched clock from the variable delay circuit 32 allowing it to stay synchronized even in the event of phase change settings. By placing the programmable delay circuit 36 in the post-sampled data path between the sampling circuit 34 and the downstream digital processing circuit 40, any distortions or perturbations potentially caused by the programmable delay circuit 36 will not introduce errors in the overall processing because any errors are introduced into the digital data stream after the sampling device.

Figure 4:
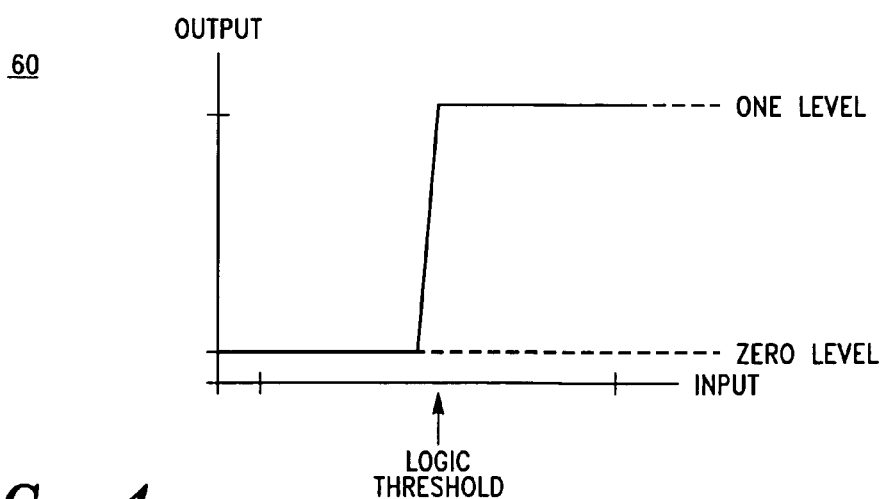
FIG. 4 is a graphic illustration of the transfer function for a digital waveform.

FIG. 4 graphically demonstrates why having perturbations in the digitally sampled portion of the data processing path is acceptable. In this figure, we see the transfer function 60 of a typical digital input receiver, for example, the inputs to the downstream digital processing circuit 40. This highly non-linear process outputs a logic one level if the input is anywhere above a certain logic threshold. Similarly, the process outputs a logic zero level if the input is anywhere below a certain logic level. Variations that occur in the signals that do not cross logic threshold levels have no effect on the received data 39 as it is seen by the inputs to the digital processing circuit 40. Defects that may occur because of additional switches within the programmable delay circuit 36 may cause minor deviations in the logical ones and zeros of the sampled data stream 39; however, these deviations are easily kept to a limit that does not exceed the logic threshold level.

Figure 5:
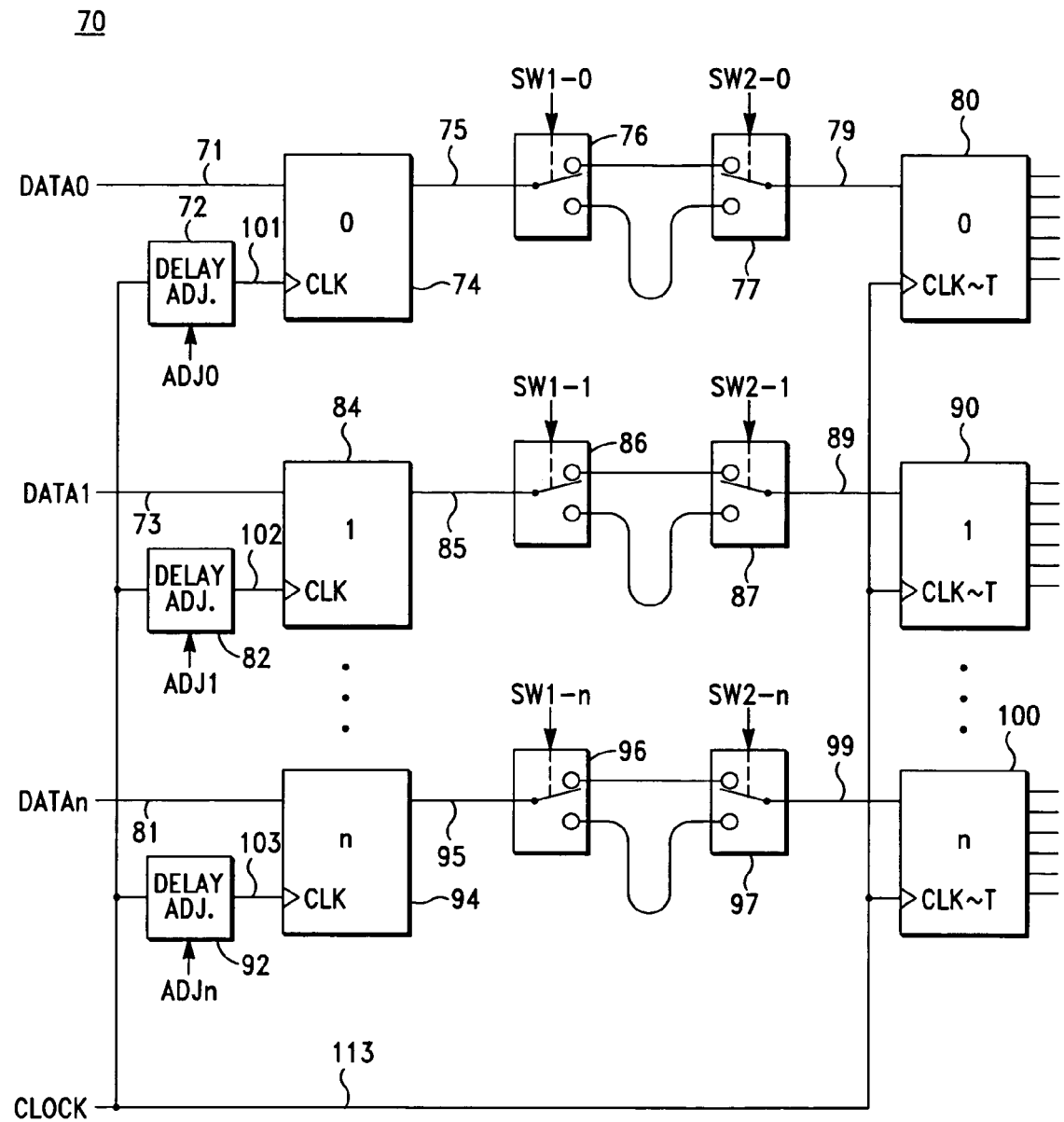
FIG. 5 is a schematic block diagram of a variable phase bit sampling device according to an alternate embodiment of the present invention.

FIG. 5 is a schematic block diagram of an alternate N-channel or multi-channel embodiment 70 of the present invention used in conjunction with multiple sampling circuits. As shown, independent variable delay adjustment signals 101-103 provided by the corresponding variable delay circuits 72, 82, 92 can be made to each of the N sampling circuits 74, 84, 94 without affecting the system clock signal 113 that is presented to each of the N digital processing circuits 80, 90, 100. In this manner, changes to the outputs of the variable delay circuits 101-103 for any channel that may cause glitches in the output clocks from the variable delay devices 72, 82, 92 will not cause glitches to the digital processing circuits 80, 90, 100 and, therefore, synchronization can be maintained in the digital processing circuits 80, 90, 100 when changes are made.

Further, this embodiment ensures that synchronization for one channel can be set and maintained with synchronization from another channel allowing for digital processing techniques that depend on continued synchronization to be performed. Individual delay switches 76, 77, 86, 87, 96, 97 are shown in this figure because each fixed-length delay segment may or may not be added into the data path depending on the given variable phase adjustment setting for that channel. Even in the case where bit borders are crossed, as will be the case in certain settings, exact phase relationships are know and remain constant allowing for digital processing that includes logical shifting to re-order bits appropriately. As in the single channel implementation illustrated in FIG. 3, the several control signals (ADJ0-ADJ3) that control the sampling periods and the several control signals (SWx-0-SWx-n) that control the delay provided by the several switches may be provided by a suitable delay controller (not shown).

Figure 6:
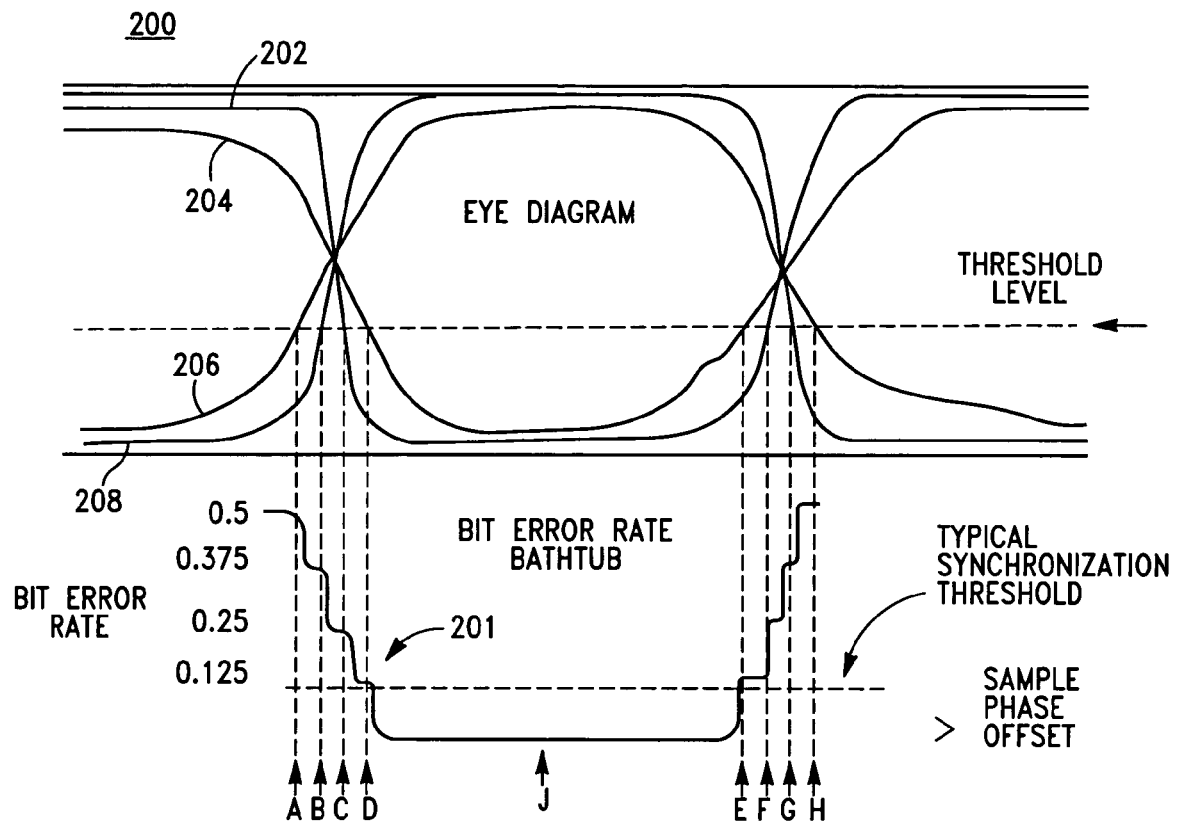
FIG. 6 is an illustration demonstrating the need for making measurements in one time offset within a data bit period from a synchronizing reference necessarily obtained at another time offset within the bit period.

FIG. 6 illustrates the ability of the present invention to use synchronization found at one clock sampling phase setting when performing further measurements at other clock sampling phases within the data bit period and the significance thereof. An eye diagram 200 is illustrated as an example. An eye diagram is the super-position of all possible bit transitions in a data stream showing clearly the possible trajectories of all types of one-to-one, one-to-zero, zero-to-zero and zero-to-one transitions in the data signal. Eye diagrams also show the opening in the center of the eye which is clear and which is an ideal location for making logic decisions about the data stream as there is little ambiguity as to whether the data signal is above or below a logical threshold. In the eye diagram 200, four different trajectories 202, 204, 206, 208 are clearly demonstrated. These types of trajectories may, for example, be caused by the frequency response of the data channel or device being tested. A common type of measurement that is performed on such a data stream is a "Bit Error Rate Bathtub" curve. This curve 201 plots the bit error rate versus the sample phase offset within the eye period at a given logic threshold. FIG. 6 shows the correlation between the eye diagram 200 and the bit error rate bathtub curve 201 for this example eye diagram. Clearly, features of this bit error rate bathtub curve 201 is present at bit error rates that are very poor (e.g. BER=0.125 indicates one bit in 8 is wrong, BER=0.5 indicates one bit in two is wrong). It is a characteristic of bit error rate measuring (e.g. sampling) devices that it is very difficult to obtain data synchronization when error rates exceed a certain level. This is illustrated in FIG. 6 as the typical synchronization threshold. Different bit error rate measuring devices offer different levels for this threshold, but all of them are well below thresholds where this example shows there are still characteristics of the BER bathtub that would want to be measured. The present invention provides that synchronization can be obtained at a clean phase offset within the bit period (i.e. point J) and then the phase offset can be moved to the areas of high bit error rate while synchronization is maintained from the J location to enable proper bit error rate measurements at these high error rate bit phase offset settings.

What is claimed is:

1. A sampling device, comprising:
   a sampling circuit operative to provide an output signal in response to a data signal, the sampling circuit having a data input and a clock input;
   a variable delay circuit, coupled to the sampling circuit, operative to provide an adjustable trigger signal to the clock input in response to a first delay control signal;
   a programmable delay circuit, coupled to the sampling circuit, operative to delay the output signal by a predetermined amount of time in response to at least one second delay control signal;
   a frequency detection and measurement circuit operative to provide a clock frequency signal in response to a system clock signal; and
   a delay controller, coupled to the frequency detection and measurement circuit, operative to provide the first delay control signal and the at least one second delay control signal in response to the clock frequency signal.

2. The sampling device of claim 1, wherein the delay controller further provides the first delay control signal and the at least one second delay control signal in response to a desired clock frequency control signal and a desired input sampling phase of the sampling circuit.

3. The sampling device of claim 2, wherein the delay controller further provides a second delay control signal, operative to adjust the delay period between the output signal and the delayed output in response to the clock frequency signal and a desired input sampling phase of the sampling circuit.

4. The sampling device of claim 3, wherein the programmable delay circuit further includes a first switch that provides a first amount of delay to the output signal in response to the first delay control signal, and a second switch that provides a second amount of delay to the output signal in response to the second delay control signal, wherein the total amount of delay of the output signal does not exceed the setup and hold time of downstream processing circuits.

5. The sampling device of claim 1, wherein the variable delay circuit is configured solely in the signal path between the system clock and the clock input of the sampling circuit.

6. A variable phase threshold sampling device, comprising:
   a sampling circuit operative to provide an output signal in response to an adjustable trigger signal;
   a variable delay circuit, coupled to the sampling circuit, operative to provide the adjustable trigger signal in response to a first delay control signal;
   a delay controller, coupled to the variable delay circuit, operative to provide the first delay control signal in response to a clock frequency signal and a desired phase signal; and
   a programmable delay circuit, coupled to the sampling circuit, operative to delay the output signal by a predetermined amount of time in response to at least one second control signal.

7. The variable phase threshold sampling device of claim 6, wherein the at least one second control signal further includes a second control signal and a third control signal, and wherein the programmable delay circuit further includes a first switch and a second switch, the first switch operative to delay the output signal by a first predetermined amount of time in response to the second control signal, and the second switch being operative to delay the output by a second predetermined amount of time in response to the third control signal.

8. The variable phase threshold sampling device of claim 7, further including a frequency detection and measurement circuit operative to provide the clock frequency signal in response to the delay controller in response to a system clock.

* * * * *